(12) United States Patent
Shibasaki

(10) Patent No.: US 9,344,269 B2
(45) Date of Patent: May 17, 2016

(54) RECEIVING CIRCUIT

(71) Applicant: FUJITSU LIMITED, Kawasaki-shi, Kanagawa (JP)

(72) Inventor: Takayuki Shibasaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/681,794

(22) Filed: Apr. 8, 2015

(65) Prior Publication Data

US 2015/0349783 A1    Dec. 3, 2015

(30) Foreign Application Priority Data

May 30, 2014    (JP) .................................. 2014-112889

(51) Int. Cl.
| | | |
|---|---|---|
| H04L 7/033 | (2006.01) | |
| H03L 7/089 | (2006.01) | |
| H03B 5/12 | (2006.01) | |
| H03L 7/07 | (2006.01) | |
| H03L 7/093 | (2006.01) | |

(52) U.S. Cl.
CPC .............. *H04L 7/033* (2013.01); *H03B 5/1212* (2013.01); *H03L 7/07* (2013.01); *H03L 7/0891* (2013.01); *H03L 7/093* (2013.01); *H04L 7/0331* (2013.01)

(58) Field of Classification Search
CPC ....... H04L 7/033; H04L 7/0331; H03L 7/093; H03L 7/0891; H03L 7/07
USPC .......... 375/376, 374; 327/156, 157; 331/2, 17
See application file for complete search history.

(56) References Cited

U.S. PATENT DOCUMENTS

| | | | | |
|---|---|---|---|---|
| 6,307,906 | B1 * | 10/2001 | Tanji ..................... | H03D 13/004 375/375 |
| 6,526,112 | B1 * | 2/2003 | Lai ............................ | H03L 7/07 375/375 |
| 6,771,729 | B1 * | 8/2004 | Takahashi ............. | H03L 7/0898 327/148 |
| 7,321,612 | B2 * | 1/2008 | Tonietto ........... | G11B 20/10009 342/151 |
| 7,590,207 | B1 * | 9/2009 | Shumarayev ........... | H03L 7/087 331/11 |
| 8,279,992 | B1 * | 10/2012 | Li ........................... | H04L 7/033 327/157 |
| 2004/0240599 | A1 | 12/2004 | Takasoh | |

FOREIGN PATENT DOCUMENTS

| | | |
|---|---|---|
| JP | 2004-356701 A | 12/2004 |
| JP | 2010-063054 A | 3/2010 |
| WO | WO 2009/096413 A1 | 8/2009 |

* cited by examiner

*Primary Examiner* — Ryan Johnson
(74) *Attorney, Agent, or Firm* — Arent Fox LLP

(57) ABSTRACT

A receiving circuit includes circuits arranged in parallel, each circuits including a voltage-controlled-oscillator (VCO) configured to generate a clock having an oscillation frequency according to an inductor and a capacitor, and a gain circuit. Each circuit is configured to sample a piece of input data with an output clock of the VCO and adjust the oscillation frequency of the VCO based on a phase difference and a frequency difference between the piece of input data and the output clock, thereby recovering data and a clock based on the piece of input data. The gain circuit is configured to adjust ratios of gains of up and down of the oscillation frequency of the VCO in a loop in each circuit arranged adjacent to each other, based on a phase difference between the pieces of input data and a phase difference between the output clocks of the respective circuits.

10 Claims, 14 Drawing Sheets

RECEIVING CIRCUIT

CROSS-REFERENCE TO RELATED APPLICATION

This application is based upon and claims the benefit of priority of the prior Japanese Patent Application No. 2014-112889, filed on May 30, 2014, the entire contents of which are incorporated herein by reference.

FIELD

The embodiments discussed herein are related to a receiving circuit.

BACKGROUND

With improvements in the performances of information processing apparatuses such as devices for communication backbones and servers, the data rates of transmission and reception of signals in and out of the devices are desired to be increased. For a receiving circuit, a so-called clock-and-data recovery (CDR) is desired, which determines transmitted data at an appropriate timing and recovers data and a clock. The clock-and-data recovery is achieved by detecting a phase difference between input data and a clock (sampling clock) that is used for sampling data, and adjusting the phase of the sampling clock based on the phase difference thus detected.

For example, a clock-and-data recovery circuit (CDR circuit) of a voltage controlled oscillator (VCO) type (or a phase locked loop (PLL) type) is known, which adjusts the phase of a sampling clock by adjusting a control voltage of a voltage controlled oscillator. As the voltage controlled oscillator, an LC voltage controlled oscillator is known, which is capable of high-frequency oscillations with a low noise (see, for example, International Publication Pamphlet No. WO2009/096413 and Japanese Laid-open Patent Publication No. 2004-356701). The LC voltage controlled oscillator generates a clock signal having an oscillation frequency according to an inductor and a capacitor. In addition, a communication semiconductor integrated circuit including a plurality of LC voltage controlled oscillators in a PLL circuit has been proposed (see, for example, Japanese Laid-open Patent Publication No. 2010-63054).

FIG. 14 illustrates a configuration example of a receiving circuit configured with two lanes through which to receive data in parallel. The receiving circuit illustrated in FIG. 14 includes: a first CDR circuit (CDR1) 1400-1 configured to receive input data DI1 and output output data DO1; and a second CDR circuit (CDR2) 1400-2 configured to receive input data DI2 and output output data DO2. Since the first CDR circuit 1400-1 and the second CDR circuit 1400-2 are configured and operate in the same manner, the first CDR circuit 1400-1 will be described as an example.

The first CDR circuit 1400-1 determines whether the input data DI1 is "0" or "1" by use of a comparator circuit (determination circuit) 1401, and outputs the result of the determination as output data DO1. The comparator circuit (determination circuit) 1401 uses an output clock CK1 of an LC voltage controlled oscillator (LC VCO) 1405 as a sampling clock, and makes the determination on the input data DI1 at the timing of the clock CK1.

A phase-frequency detector circuit (PFD) 1402 detects a phase difference and a frequency difference between the input data DI1 and the clock CK1, and outputs an up signal UP1 and a down signal DN1 in accordance with the result of the detection.

A charge pump circuit (CP) 1403 and a loop filter (LPF) 1404 generate a control voltage VCOC1 by performing addition or subtraction of a current (injection or extraction of electric charges) in accordance with the up signal UP1 and the down signal DN1 outputted from the phase-frequency detector circuit 1402. The LC voltage controlled oscillator 1405 generates a clock having an oscillation frequency according to the control voltage VCOC1, and outputs the clock as an output clock CK1. With the above-described operation, the output clock CK1 of the LC voltage controlled oscillator 1405 is locked to the input data DI1, so that the function of the clock-and-data recovery is achieved.

A receiving circuit having a plurality of lanes, which receives a plurality of pieces of data and outputs a plurality of pieces of data in parallel through a plurality of CDR circuits, is generally implemented by arranging circuits of the respective lanes in parallel. If LC voltage controlled oscillators included in the CDR circuits of the respective lanes are arranged adjacent to each other, interference occurs between the LC voltage controlled oscillators due to mutual coupling of inductors of the LC voltage controlled oscillators. This interference causes injection locking, by which the phases of the clocks of the LC voltage controlled oscillators which are oscillating at nearby frequencies are shifted such that the outputs of the LC voltage controlled oscillators have the same phase and frequency.

When interference occurs between the LC voltage controlled oscillators in the loops of the CDR circuits, the phases of the LC voltage controlled oscillators are shifted in directions that make the phase difference between their output clocks smaller as indicated in FIG. 15, thus causing a phase error. A large interference between the LC voltage controlled oscillators relative to the loop gain of the CDR circuit causes a large phase error, leading to deterioration in the characteristics of the CDR circuit. In FIG. 15, a clock CK1 indicates a clock to be locked to input data DI1 while a clock CK2 indicates a clock to be locked to input data DI2. In addition, regarding the clocks CK1, CK2, dotted lines indicate an example of a case where there is no interference between the LC voltage controlled oscillators while solid lines indicate an example of a case where the phases are shifted by interference between the LC voltage controlled oscillators.

FIGS. 16A to 16C indicate influences of interference between LC voltage controlled oscillators. Each of the diagrams indicates a relation between an input phase difference $\theta in\_d/2\pi$ (corresponding to the phase difference between the input data DI1 and DI2 in the example illustrated in FIG. 14) and a clock phase difference $\theta d/2\pi$ (corresponding to the phase difference between the clocks CK1 and CK2 in the example illustrated in FIG. 14). Each CDR circuit is controlled such that the clock is conformed to the phase of the input data. Accordingly, the input phase difference and the clock phase difference are ideally converged and equalized.

In a case where there is no interference between the LC voltage controlled oscillators included in the CDR circuits, the input phase difference and the clock phase difference are equalized as indicated in FIG. 16A. However, in a case where there is interference, a convergence phase error occurs as indicated in FIGS. 16B and 16C. Moreover, even in the case where there is interference between the LC voltage controlled oscillators included in the CDR circuits, no convergence phase error occurs when the input phase difference takes 0 or $\pi$, while a convergence phase error occurs when the input phase difference takes another value, as indicated in FIGS. 16B and 16C. In other words, this phase error varies depending on the magnitude of the input phase difference (the phase difference between input data) and on the magnitude of the interference between LC voltage controlled oscillators.

Increasing the loop gains of the CDR circuits allows for reducing the influence of interference between the LC voltage controlled oscillators, but changes the characteristics of the CDR circuits. In addition, since the loop gain of a CDR circuit is generally defined in its standards and has an optimum magnitude fixed in view of its performance, it is difficult to simply increase the loop gains of the CDR circuits.

For these reason, the LC voltage controlled oscillators (CDR circuits) are desirably implemented at a sufficient distance to reduce the influence of the interference, and are thus difficult to implement at a high density.

SUMMARY

According to an aspect of the invention, a receiving circuit includes: clock-and-data-recovery-circuits arranged in parallel, each of the clock-and-data-recovery-circuits including an LC-voltage-controlled-oscillator configured to generate a clock having an oscillation frequency according to an inductor and a capacitor, each clock-and-data-recovery-circuit being configured to sample a piece of input data with an output clock of the LC-voltage-controlled-oscillator and adjust the oscillation frequency of the LC-voltage-controlled-oscillator in accordance with a phase difference and a frequency difference between the piece of input data and the output clock of the LC-voltage-controlled-oscillator, thereby recovering data and a clock based on the piece of input data; and a gain-adjustment-circuit configured to adjust ratios of gains of up and down of the oscillation frequency of the LC-voltage-controlled-oscillator in a loop in each of the clock-and-data-recovery-circuits arranged adjacent to each other, in accordance with a phase difference between the pieces of input data and a phase difference between the output clocks of the respective clock-and-data-recovery-circuits.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, embodiments will be described with reference to the drawings.

In a receiving circuit having a plurality of lanes in which clock-and-data recovery circuits (CDR circuits) each having an LC voltage controlled oscillator are respectively arranged, a convergence phase error in the CDR circuits varies, depending on a phase difference between input data and a phase difference between clocks in adjacent lanes, due to interference between the LC voltage controlled oscillators. In view of this, in the embodiments described below, a phase difference between input data and a phase difference between clocks in adjacent lanes are detected, and ratios of the gains of up (UP) and down (DN) in the loop of each CDR circuit, which increase and decrease the oscillation frequency of the LC voltage controlled oscillator, are adjusted in accordance with the detected phase differences. In this way, the convergence phase error is corrected without changing the loop gain of the CDR circuit.

First Embodiment

A first embodiment will be described.

Figure 1A:
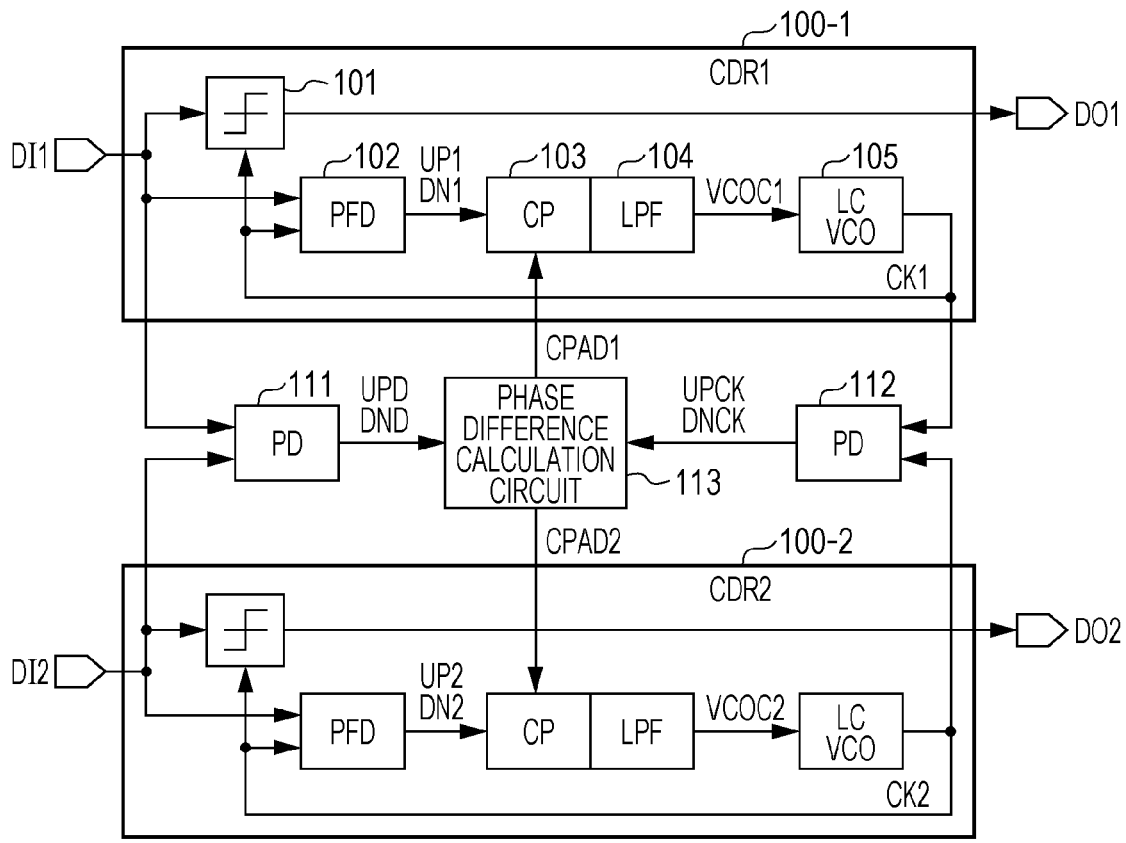
FIGS. 1A and 1B are diagrams for explaining a receiving circuit in a first embodiment.

FIG. 1A is a diagram illustrating a configuration example of a receiving circuit in the first embodiment. FIG. 1A illustrates, as an example, a receiving circuit configured with two lanes through which two CDR circuits receive data and output data in parallel. The receiving circuit illustrated in FIG. 1A includes: a first CDR circuit (CDR1) 100-1 configured to receive input data DI1 and output output data DO1; a second CDR circuit (CDR2) 100-2 configured to receive input data DI2 and output output data DO2; phase detector circuits (PDs) 111, 112; and a phase difference calculation circuit 113. The phase detector circuits 111, 112 and the phase difference calculation circuit 113 constitute an example of a gain adjustment circuit.

Each of the CDR circuits 100 includes an LC voltage controlled oscillator. The CDR circuit 100 samples the input data by use of an output clock of the LC voltage controlled oscillator, and adjusts the oscillation frequency of the LC voltage controlled oscillator in accordance with a phase difference and a frequency difference between the input data and the output clock of the LC voltage controlled oscillator, thereby recovering data and a clock based on the input data.

Each of the CDR circuits 100-$i$ ($i$ is an index and is 1 or 2 in the example illustrated in FIG. 1A) includes a comparator circuit (determination circuit) 101, a phase-frequency detector circuit (PFD) 102, a charge pump circuit (CP) 103, a loop filter (LPF) 104, and an LC voltage controlled oscillator (LC VCO) 105. The comparator circuit 101 uses an output clock CKi of the LC voltage controlled oscillator 105 as a sampling clock, determines whether the input data DIi is "0" or "1" at the timing of the clock CKi, and outputs the result of the determination as output data DOi.

The phase-frequency detector circuit 102 detects the phase difference and the frequency difference between the input data DIi and the clock CKi, and outputs an up signal UPi or a down signal DNi, which provides instruction to increase or decrease a control voltage VCOCi, in accordance with the result of the detection. The charge pump circuit 103 and the loop filter 104 generate the control voltage VCOCi by performing addition or subtraction of a current (injection or extraction of electric charges) in accordance with the up signal UPi and the down signal DNi, which are outputted from the phase-frequency detector circuit 102, and an output CPADi of the phase difference calculation circuit 113.

The LC voltage controlled oscillator 105 generates a clock having an oscillation frequency according to an inductor (L) and a capacitor (C). The LC voltage controlled oscillator 105 includes a variable capacitor, for example. The oscillation frequency of the LC voltage controlled oscillator 105 is controlled by adjusting the capacitance value of the variable capacitor with the control voltage VCOCi, so that the LC voltage controlled oscillator 105 outputs, as the output clock CKi, a clock having a frequency according to the supplied control voltage VCOCi.

The phase detector circuit 111 detects the phase difference between the input data DI1, which is inputted to the CDR circuit 100-1, and the input data DI2, which is inputted to the CDR circuit 100-2, and outputs an up signal UPD or a down signal DND in accordance with the result of the detection. In short, the phase detector circuit 111 outputs the up signal UPD or the down signal DND in accordance with the phase difference between the input data DI1, DI2 in the adjacent lanes.

The phase detector circuit 112 detects the phase difference between the clock CK1, which is outputted from the LC voltage controlled oscillator 105 of the CDR circuit 100-1, and the clock CK2, which is outputted from the LC voltage controlled oscillator 105 of the CDR circuit 100-2, and outputs an up signal UPCK and a down signal DNCK in accordance with the result of the detection. In short, the phase detector circuit 112 outputs the up signal UPCK or the down signal DNCK in accordance with the phase difference between the clocks CK1, CK2 in the adjacent lanes.

The phase difference calculation circuit 113 generates outputs CPAD1, CPAD2 according to the difference between the phase difference between the input data DI1, DI2 and the phase difference between the clocks CK1, CK2, based on the up signal UPD and the down signal DND, which are outputted from the phase detector circuit 111, as well as the up signal UPCK and the down signal DNCK, which are outputted from the phase detector circuit 112. The output CPAD1 of the phase difference calculation circuit 113 is supplied to the charge pump circuit 103 of the CDR circuit 100-1, and the ratios of the gains of up (UP) and down (DN) in the loop of the CDR circuit 100-1 are adjusted based on the output CPAD1. On the other hand, the output CPAD2 of the phase difference calculation circuit 113 is supplied to the charge pump circuit 103 of the CDR circuit 100-2, and the ratios of the gains of up (UP) and down (DN) in the loop of the CDR circuit 100-2 are adjusted based on the output CPAD2.

Figure 1B:
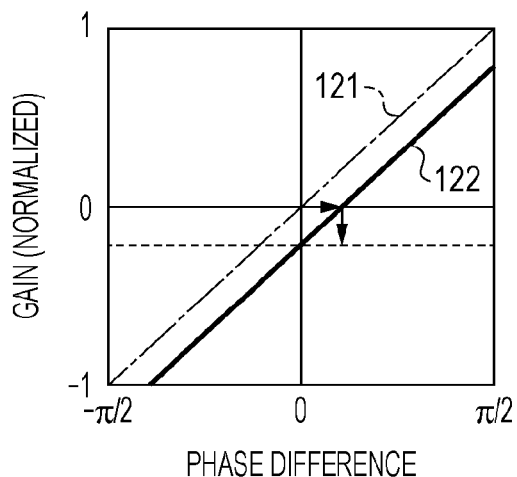

FIG. 1B is a diagram indicating a gain relative to an input phase difference in the loop of the CDR circuit. In FIG. 1B, the horizontal axis indicates the phase difference between the input data and the clock, and the vertical axis indicates the normalized gain. When there is no interference between the LC voltage controlled oscillators, the characteristic of the gain is as indicated by a long dashed dotted line 121 in FIG. 1B, and is converged (the gain becomes zero) at a portion where there is no phase difference between the input data and the clock.

However, if there is interference between the LC voltage controlled oscillators, the influence of the interference increases the gain in a direction that makes the clock phase difference between the adjacent lanes smaller. As a result, the characteristic of the gain is changed (shifted) as indicated by a solid line 122 in FIG. 1B, for example. Without gain adjustment or the like, the characteristic is converged at a point where the gain becomes zero. For this reason, if the characteristic of the gain is changed as indicated by the solid line 122, a convergence phase error occurs.

In view of this, in the receiving circuit according to the first embodiment, the gains of the up signal (UP) and the down signal (DN) in the charge pump circuit 103 of the CDR circuit 100 are adjusted by use of the outputs CPAD1, CPAD2 of the phase difference calculation circuit 113 to adjust the ratios of the gains of up and down in the loop of the CDR circuit 100. In this way, the ratios of the gains of up and down in the loop of the CDR circuit are adjusted to be converged with the gain indicated by a dashed line in FIG. 1B, for example, to cancel the influence of the interference between the LC voltage controlled oscillators 105. In this way, the convergence phase error can be reduced.

Figure 2:
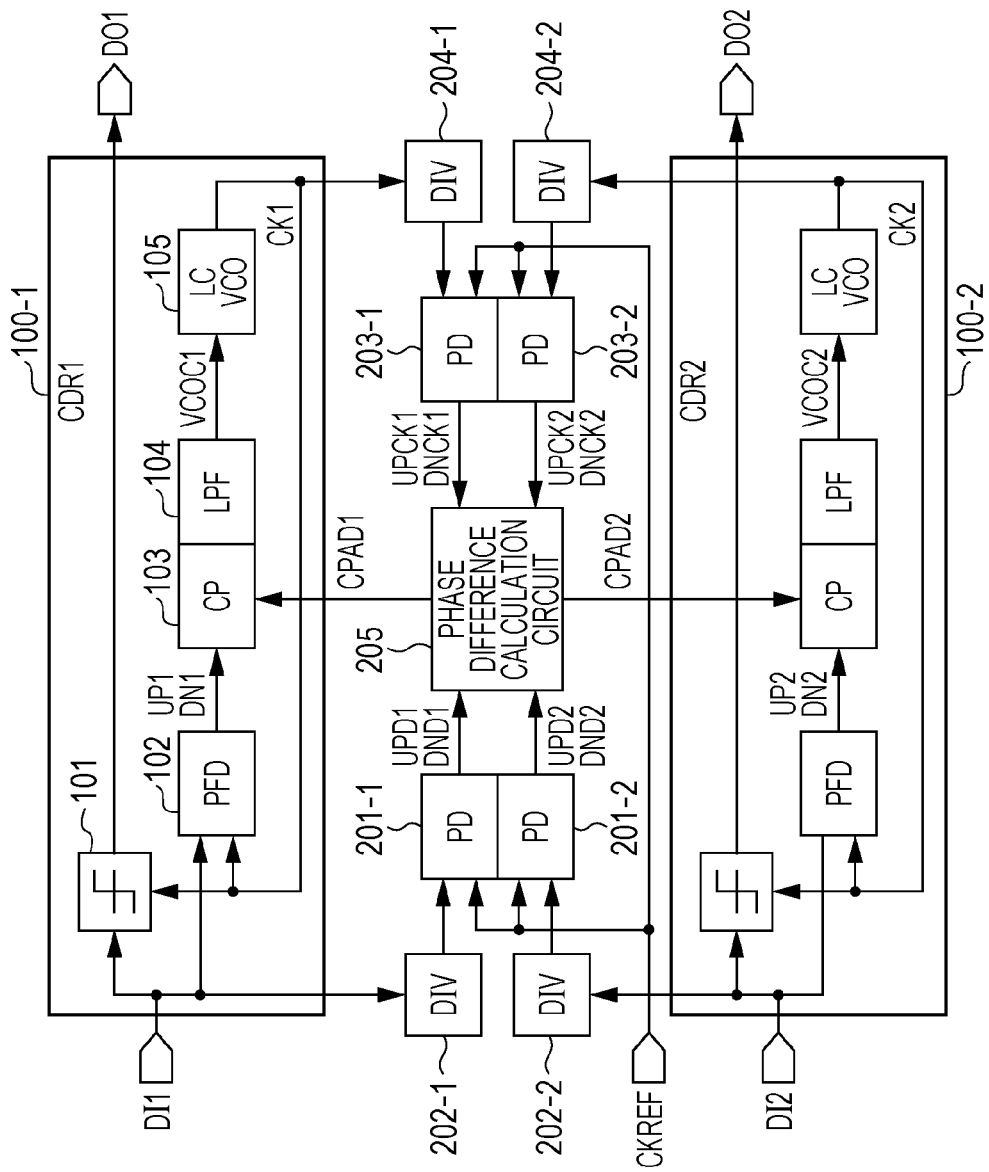
FIG. 2 is a diagram illustrating a configuration example of the receiving circuit in the first embodiment.

FIG. 2 is a diagram illustrating, in more detail, a configuration example of the receiving circuit in the first embodiment illustrated in FIG. 1A. The receiving circuit illustrated in FIG. 2 includes: two CDR circuits 100-$i$ each configured to receive input data DIi and output output data DOi; phase detector circuits 201-1, 201-2, 203-1, 203-2; frequency divider circuits (DIVs) 202-1, 202-2, 204-1, 204-2; and a phase difference calculation circuit 205.

Each of the CDR circuits 100-$i$ includes the comparator circuit 101, the phase-frequency detector circuit 102, the charge pump circuit 103, the loop filter 104, and the LC voltage controlled oscillator 105. The comparator circuit 101 uses the output clock CKi of the LC voltage controlled oscillator 105 as a sampling clock, determines whether the input data DIi is "0" or "1" at the timing of the clock CKi, and outputs the result of the determination as the output data DOi.

Figure 3A:
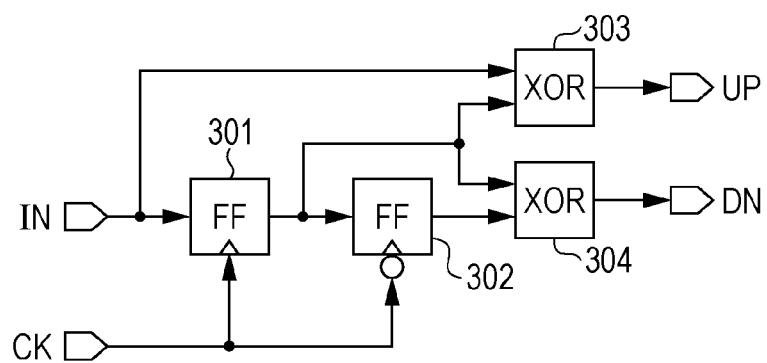
FIGS. 3A and 3B are diagrams illustrating an example of a phase detector circuit in the first embodiment.

The phase-frequency detector circuit 102 detects the phase difference and the frequency difference between the input data DIi and the clock CKi outputted from the LC voltage controlled oscillator 105, and outputs the up signal UPi or the down signal DNi, which provides instruction to increase or decrease the control voltage VCOCi, in accordance with the result of the detection. FIG. 3A is a diagram illustrating a configuration example of the phase-frequency detector circuit in the first embodiment. FIG. 3A illustrates, as an example, a Hogge-type phase detector circuit including flip-flops 301, 302 and exclusive OR logic circuits (XOR circuits) 303, 304.

The flip-flop 301 holds and outputs an input IN at the rising edges of the clock CK. The flip-flop 302 holds and outputs the output of the flip-flop 301 at the falling edges of the clock CK. The XOR circuit 303 receives and performs a logical operation on the input IN and the output of the flip-flop 301, and outputs the result of the logical operation as an up signal UP. The XOR circuit 304 receives and performs a logical operation on the outputs of the flip-flops 301, 302, and outputs the result of the logical operation as a down signal DN.

According to the phase detector circuit illustrated in FIG. 3A, when the phase of the clock CK lags behind the phase of the input IN, the up signal UP is asserted (a high level in this example) for a longer period of time than that of the down signal DN. On the other hand, when the phase of the clock CK is ahead of the phase of the input IN, the up signal UP is asserted for a shorter period of time than that of the down signal DN.

Figure 3B:
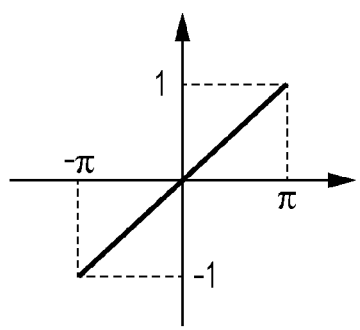

FIG. 3B is a diagram illustrating an example of an output characteristic of the phase detector circuit illustrated in FIG. 3A. In FIG. 3B, the horizontal axis indicates the phase difference between the input IN and the clock CK, and the vertical axis indicates the normalized output characteristic (UP-DN). The gain of this phase detector circuit has a linear characteristic with respect to the phase difference between the input IN and the clock CK. The gain of the phase detector circuit is expressed by TD/π, where TD represents a transition density of the input IN.

Figure 4:
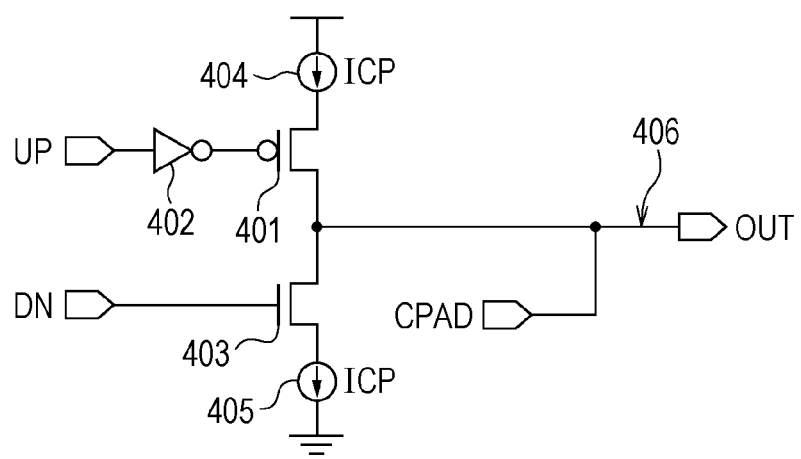
FIG. 4 is a diagram illustrating a configuration example of a charge pump circuit in the first embodiment.

The charge pump circuit 103 performs addition or subtraction of a current (injection or extraction of electric charges) on a supply node of the control voltage VCOCi in accordance with the up signal UPi and the down signal DNi, which are outputted from the phase-frequency detector circuit 102, and the output CPADi of the phase difference calculation circuit 113. FIG. 4 is a diagram illustrating a configuration example of the charge pump circuit 103 in the first embodiment. The charge pump circuit 103 includes: a P-channel transistor 401, which functions as a switch; an inverter 402; a N-channel transistor 403, which functions as a switch; and a current sources 404, 405. Each of the P-channel transistor 401 and the N-channel transistor 403 is a MOS transistor, for example. The current source 404 is a current source connected to a power supply potential node and configured to supply a current ICP. The current source 405 is a current source connected to a reference potential node (for example, a ground potential node) and configured to supply a current ICP. The current sources 404, 405 have transistors connected in a current mirror configuration, for example.

The P-channel transistor 401 has a gate to which an up signal UP is inputted through the inverter 402 and a source which is connected to the current source 404. The N-channel transistor 403 has a gate to which a down signal DN is supplied and a source which is connected to the current source 405. A drain of the P-channel transistor 401 and a drain of the N-channel transistor 403 are connected at a connection point that is connected to the output node OUT. In addition, an output CPAD of the corresponding phase difference calculation circuit 113 is supplied to the output node OUT.

In the charge pump circuit illustrated in FIG. 4, during a period of time when the up signal UP is asserted (a high level in this example), the P-channel transistor 401 goes into an on state (energized state), so that the current ICP (a corresponding amount of charges) is injected into the output node OUT. On the other hand, during a period of time when the down signal DN is asserted (a high level in this example), the N-channel transistor 403 goes into an on state (energized state), so that the current ICP (a corresponding amount of charges) is extracted from the output node OUT.

In this way, in the charge pump circuit, a voltage level of the output node OUT changes in accordance with the periods of time when the inputted up signal UP and the inputted down signal DN are respectively asserted. Moreover, addition and subtraction of a current (injection and extraction of electric charges) on the output node OUT is performed in accordance with the output CPAD from the corresponding phase difference calculation circuit 113, so that the voltage level of the output node OUT of the charge pump circuit is changed. In short, the charge pump circuit in the first embodiment is such that the voltage level of the output node OUT is changed in accordance with the periods of time when the inputted up signal UP and the inputted down signal DN are respectively asserted and the output CPAD from the corresponding phase difference calculation circuit 113. The output node OUT is connected to a loop filter, for example, and charges and discharges the capacitor included in the loop filter.

Figure 5:
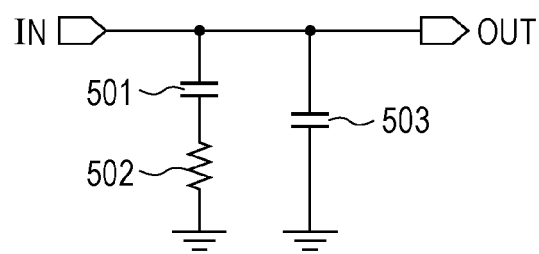
FIG. 5 is a diagram illustrating a configuration example of a loop filter in the first embodiment.

The loop filter 104 filters and removes a high-frequency component of the output of the charge pump circuit 103, and allows a low-frequency component to pass therethrough to generate the control voltage VCCi. The loop filter 104 includes: a capacitor 501 and a resistor 502 connected in series between an input node IN (output node OUT) and the reference potential node; and a capacitor 503 connected between the input node IN (output node OUT) and the reference potential node, for example as illustrated in FIG. 5.

The LC voltage controlled oscillator 105 generates a clock having an oscillation frequency according to the inductor (L) and the capacitor (C). The oscillation frequency of the LC voltage controlled oscillator 105 is controlled by adjusting the capacitance value of the variable capacitor with the control voltage VCOCi, so that the LC voltage controlled oscillator 105 outputs, as the output clock CKi, a clock having a frequency according to the supplied control voltage VCOCi.

Figure 6:
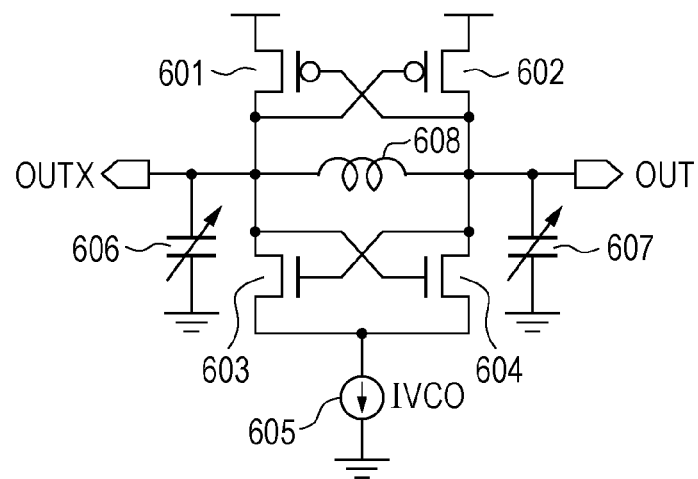
FIG. 6 is a diagram illustrating a configuration example of an LC voltage controlled oscillator in the first embodiment.

FIG. 6 is a diagram illustrating a configuration example of the LC voltage controlled oscillator 105 in the first embodiment. The LC voltage controlled oscillator 105 includes: P-channel transistors 601, 602; N-channel transistors 603, 604; a current source 605; variable capacitors 606, 607; and an inductor 608. Each of the P-channel transistors 601, 602 and the N-channel transistors 603, 604 is a MOS transistor, for example. The current source 605 is a current source configured to supply a current IVCO.

The P-channel transistor 601 has a gate connected to a positive-side output node OUT, a source connected to a power supply potential node, and a drain connected to a negative-side output node OUTX. The P-channel transistor 602 has a gate connected to the negative-side output node OUTX, a source connected to the power supply potential node, and a drain connected to the positive-side output node OUT. The N-channel transistor 603 has a gate connected to the positive-side output node OUT, a drain connected to the negative-side output node OUTX, and a source connected to the current source 605. The N-channel transistor 604 has a gate connected to the negative-side output node OUTX, a drain connected to the positive-side output node OUT, and a source connected to the current source 605. Each of the variable capacitors 606, 607 is connected between the positive-side output node OUT and the negative-side output node OUTX, and has a capacitance value controlled with the control voltage VCOC. The inductor 608 is connected between the positive-side output node OUT and the negative-side output node OUTX.

The LC voltage controlled oscillator 105 illustrated in FIG. 6 includes: the P-channel transistors 601, 602 cross-coupled to each other; and the N-channel transistors 603, 604 cross-coupled to each other, and the current supplied by the current source 605 is adjusted. The oscillation frequency of the LC voltage controlled oscillator 105 depends on the inductance value of the inductor 608 and the capacitance values of the variable capacitors 606, 607. The oscillation frequency is controlled by adjusting the capacitance values of the variable capacitors 606, 607 with the control voltage VCOC. Note that the LC voltage controlled oscillator 105 may be configured such that a plurality of capacitors are connected in parallel as the variable capacitor, and the capacitance value is adjusted by controlling electrical connection and disconnection of each capacitor with the control voltage VCOC.

The phase detector circuit 201-1 detects the phase difference between a reference clock CKREF and input data DI1 frequency-divided by the frequency divider circuit 202-1, and outputs an up signal UPD1 and a down signal DND1 in accordance with the result of the detection. The phase detector circuit 201-2 detects the phase difference between the reference clock CKREF and input data DI2 frequency-divided by the frequency divider circuit 202-2, and outputs an up signal UPD2 and a down signal DND2 in accordance with the result of the detection.

The phase detector circuit 203-1 detects the phase difference between the reference clock CKREF and a clock CK1 frequency-divided by the frequency divider circuit 204-1, and outputs an up signal UPCK1 and a down signal DNCK1 in accordance with the result of the detection. The phase detector circuit 203-2 detects the phase difference between the reference clock CKREF and a clock CK2 frequency-divided by the frequency divider circuit 204-2, and outputs an up signal UPCK2 and a down signal DNCK2 in accordance with the result of the detection.

The configuration of each of the phase detector circuits 201-1, 201-2 and the phase detector circuits 203-1, 203-2 is the same as that of the phase detector circuit illustrated in FIG. 3A, for example. In addition, the frequency division by the frequency divider circuits 202-1, 202-2 and the frequency divider circuits 204-1, 204-2 is performed to alleviate operation speed requirements for the circuits on the subsequent stages, and may take various frequency division ratios depending on the configuration. Note that when the circuits on the subsequent stages are capable of processing, the frequency divider circuit 202-1, 202-2 or the frequency divider circuit 204-1, 204-2 may not be provided in the configuration.

The phase difference calculation circuit 205 generates outputs CPAD1, CPAD2 according to the phase difference between the input data DI1, DI2 of the CDR circuits 100-1, 100-2 and the phase difference between the output clocks CK1, CK2 of the LC voltage controlled oscillator 105 based on signals outputted from the phase detector circuits 201-1, 201-2 and the phase detector circuits 203-1, 203-2.

The phase difference calculation circuit 205 obtains the phase difference between the input data DI1, DI2 in the adjacent lanes based on the up signal UPD1 and the down signal DND1, which indicate the phase difference between the frequency-divided input data DI1 and the reference clock CKREF, as well as the up signal UPD2 and the down signal DND2, which indicate the phase difference between the frequency-divided input data DI2 and the reference clock CKREF. Similarly, the phase difference calculation circuit 205 obtains the phase difference between the clocks CK1, CK2 in the adjacent lanes based on the up signal UPCK1 and the down signal DNCK1, which indicate the phase difference between the frequency-divided clock CK1 and the reference clock CKREF as well as the up signal UPCK2 and the down signal DNCK2, which indicate the phase difference between the frequency-divided clock CK2 and the reference clock CKREF. The phase difference calculation circuit 205 then generates outputs CPAD1, CPAD2 for adjusting the gains of up and down in the loops of the CDR circuits 100-1, 100-2 in accordance with the difference between the obtained phase difference between the input data DI1, DI2 and the obtained phase difference between the clocks CK1, CK2.

Here, the transition density TD of the input data DI1, DI2 may be set to 0.5 on the assumption of random data. On the other hand, the transition density TD of the clocks CK1, CK2 is 1 because the clocks CK1, CK2 have signal transition in every cycle. In view of this, the first embodiment, adjustment is performed to match the gain of the phase detector circuits 201-1, 201-2 for the input data DI1, DI2 and the gain of the phase detector circuits 203-1, 203-2 for the clocks CK1, CK2.

For example, gain adjustment is performed in accordance with the transition density TD such that (a detection rate×a current value) is matched between the input data DI1, DI2 and the clocks CK1, CK2.

As one method of matching the gain of the phase detector circuits 201-1, 201-2 for the input data DI1, DI2 and the gain of the phase detector circuits 203-1, 203-2 for the clocks CK1, CK2, the frequency division ratios of the frequency divider circuits 202-1, 202-2 and the frequency divider circuits 204-1, 204-2 may be controlled to match the numbers of times of transition per unit time. For example, the frequency division ratios may be set such that the frequency of the frequency-divided clocks CK1, CK2 to be inputted to the phase detector circuit 203-1, 203-2 becomes one-half of the frequency component of the frequency-divided input data DI1, DI2 to be inputted to the phase detector circuit 201-1, 201-2. A configuration example of the phase difference calculation circuit 205 in this case is illustrated in FIGS. 7A and 7B.

Figure 7A:
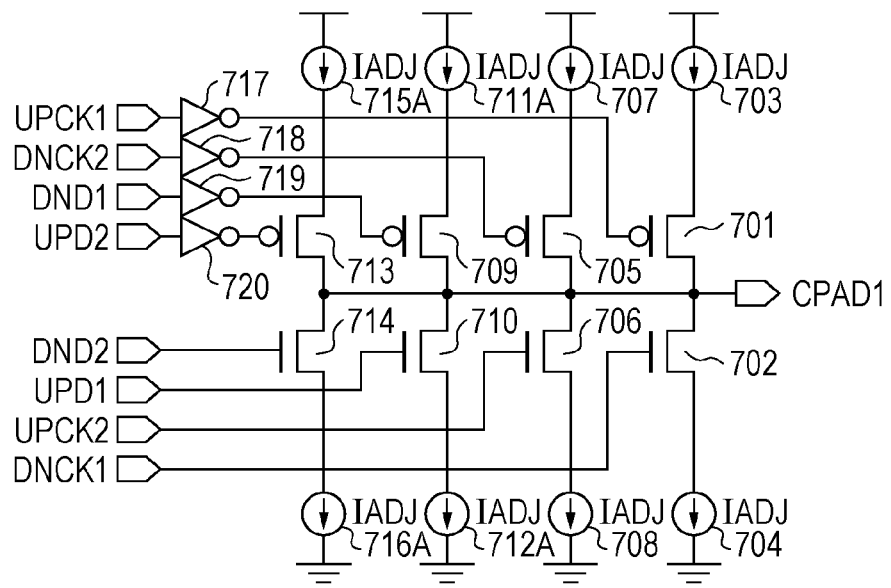
FIGS. 7A and 7B are diagrams illustrating a configuration example of a phase difference calculation circuit in the first embodiment.
Figure 7B:
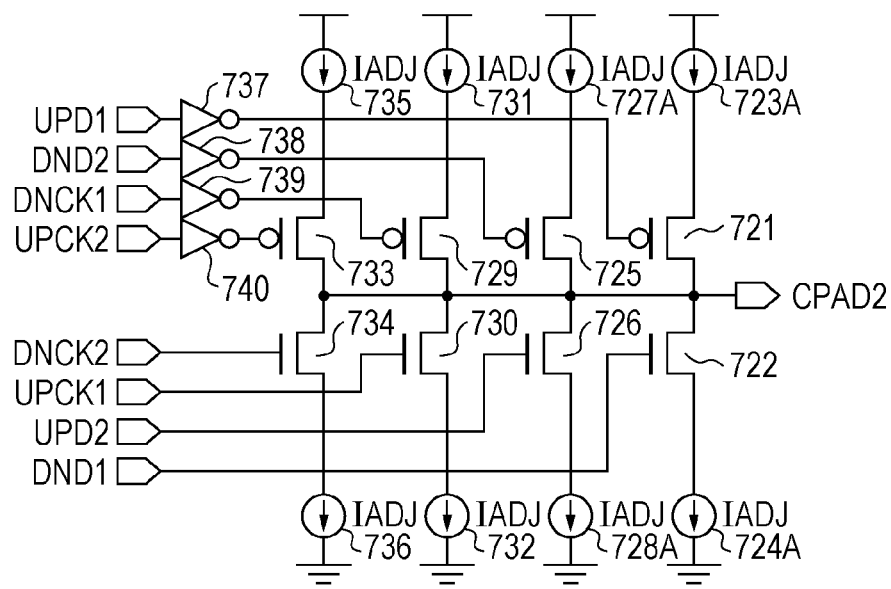

FIG. 7A is a diagram illustrating a configuration example of a circuit configured to generate the output CPAD1 in the phase difference calculation circuit 205. The circuit includes: P-channel transistors 701, 705, 709, 713; N-channel transistors 702, 706, 710, 714; inverters 717 to 720; and current sources 703, 704, 707, 708, 711A, 712A, 715A, 716A. Each of the current sources 703, 707, 711A, 715A is a current source connected to the power supply potential node and configured to supply a current IADJ. Each of the current sources 704, 708, 712A, 716A is a current source connected to the reference potential node (for example, the ground potential node) and configured to supply the current IADJ.

The P-channel transistor 701 has a gate to which an up signal UPCK1 is inputted through the inverter 717, a source connected to the current source 703, and a drain connected to the output node of the output CPAD1. The N-channel transistor 702 has a gate to which a down signal DNCK1 is inputted, a source connected to the current source 704, and a drain connected to the output node of the output CPAD1. The P-channel transistor 705 has a gate to which a down signal DNCK2 is inputted through the inverter 718, a source connected to the current source 707, and a drain connected to the output node of the output CPAD1. The N-channel transistor 706 has a gate to which an up signal UPCK2 is inputted, a source connected to the current source 708, and a drain connected to the output node of the output CPAD1.

The P-channel transistor 709 has a gate to which a down signal DND1 is inputted through the inverter 719, a source connected to the current source 711A, and a drain connected to the output node of the output CPAD1. The N-channel transistor 710 has a gate to which an up signal UPD1 is inputted, a source connected to the current source 712A, and a drain connected to the output node of the output CPAD1. The P-channel transistor 713 has a gate to which an up signal UPD2 is inputted through the inverter 720, a source connected to the current source 715A, and a drain connected to the output node of the output CPAD1. The N-channel transistor 714 has a gate to which a down signal DND2 is inputted, a source connected to the current source 716A, and a drain connected to the output node of the output CPAD1.

FIG. 7B is a diagram illustrating a configuration example of a circuit configured to generate the output CPAD2 in the phase difference calculation circuit 205. The circuit includes: P-channel transistors 721, 725, 729, 733; N-channel transistors 722, 726, 730, 734; inverters 737 to 740; and current sources 723A, 724A, 727A, 728A, 731, 732, 735, 736. Each of the current sources 723A, 727A, 731, 735 is a current source connected to the power supply potential node and configured to supply a current IADJ. Each of the current sources 724A, 728A, 732, 736 is a current source connected to the reference potential node (for example, the ground potential node) and configured to supply a current IADJ.

The P-channel transistor 721 has a gate to which an up signal UPD1 is inputted through the inverter 737, a source connected to the current source 723A, and a drain connected to the output node of the output CPAD2. The N-channel transistor 722 has a gate to which a down signal DND1 is inputted, a source connected to the current source 724A, and a drain connected to the output node of the output CPAD2. The P-channel transistor 725 has a gate to which a down signal DND2 is inputted through the inverter 738, a source connected to the current source 727A, and a drain connected to the output node of the output CPAD2. The N-channel transistor 726 has a gate to which an up signal UPD2 is inputted, a source connected to the current source 728A, and a drain connected to the output node of the output CPAD2.

The P-channel transistor 729 has a gate to which a down signal DNCK1 is inputted through the inverter 739, a source connected to the current source 731, and a drain connected to the output node of the output CPAD2. The N-channel transistor 730 has a gate to which an up signal UPCK1 is inputted, a source connected to the current source 732, and a drain connected to the output node of the output CPAD2. The P-channel transistor 733 has a gate to which an up signal UPCK2 is inputted through the inverter 740, a source connected to the current source 735, and a drain connected to the output node of the output CPAD2. The N-channel transistor 734 has a gate to which a down signal DNCK2 is inputted, a source connected to the current source 736, and a drain connected to the output node of the output CPAD2.

Note that it is desirable to adjust the current IADJ supplied by each of the current sources 703, 704, 707, 708, 711A, 712A, 715A, 716A, 723A, 724A, 727A, 728A, 731, 732, 735, 736 illustrated in FIGS. 7A and 7B, depending on the magnitude of interference between the LC voltage controlled oscillators.

Here, the phases of the waveforms of the input data DI1, DI2 and the clocks CK1, CK2 relative to the phase of the reference clock CKREF are represented by φDI1, φDI2, φCK1, φCK2, respectively. The circuit illustrated in FIG. 7A performs an operation of (φCK1−φCK2)−(φDI1−φDI2), and outputs the output CPAD1 according to the difference between the phase difference (φDI1−φDI2) between the input data DI1, DI2 and the phase difference (φCK1−φCK2) between the clocks CK1, CK2. On the other hand, the circuit illustrated in FIG. 7B performs an operation of (φDI1−φDI2)−(φCK1−φCK2), and outputs the output CPAD2 according to the difference between the phase difference (φDI1−φDI2) between the input data DI1, DI2 and the phase difference (φCK1−φCK2) between the clocks CK1, CK2. As is clear from the above description, one of the output CPAD1 and the output CPAD2 is a plus (positive) output, and the other is a minus (negative) output, and the output CPAD1 and the output CPAD2 have the same magnitude.

Alternatively, as another method of matching the gain of the phase detector circuits 201-1, 201-2 for the input data DI1, DI2 and the gain of the phase detector circuits 203-1, 203-2 for the clocks CK1, CK2, the gain of the phase detector circuits 201-1, 201-2 for the input data DI1, DI2 may be set to twice the gain of the phase detector circuits 203-1, 203-2 for the clocks CK1, CK2 while the frequency divider circuits 202-1, 202-2 and the frequency divider circuits 204-1, 204-2 are set to have the same frequency division ratio. In other words, the weight on the phase difference between the input data DI1, DI2 and the weight on the phase difference between the clocks CK1, CK2 may be made different from each other, or more specifically, the weight on the phase difference between the input data DI1, DI2 may be set to twice the weight on the phase difference between the clocks CK1, CK2. For example, in the phase difference calculation circuit 205, the current value of the current sources corresponding to the input data DI1, DI2 may be set to twice the current value of the current sources corresponding to the clock CK1, CK2. A configuration example of the phase difference calculation circuit 205 in this case is illustrated in FIGS. 8A and 8B.

Figure 8A:
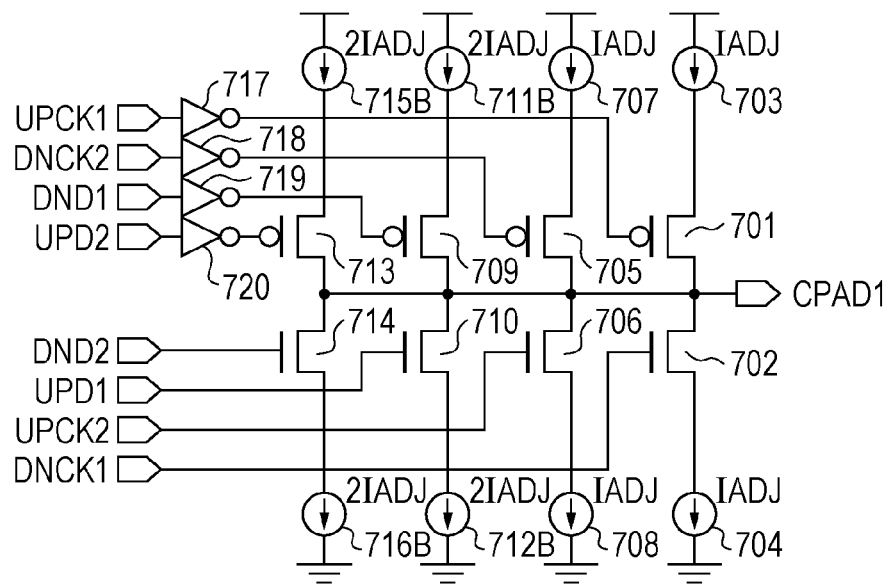
FIGS. 8A and 8B are diagrams illustrating another configuration example of the phase difference calculation circuit in the first embodiment.

FIG. 8A is a diagram illustrating a configuration example of a circuit configured to generate the output CPAD1 in the phase difference calculation circuit 205. FIG. 8B is a diagram illustrating a configuration example of a circuit configured to generate the output CPAD2 in the phase difference calculation circuit 205. The circuit illustrated in FIG. 8A is different from the circuit illustrated in FIG. 7A in that the current sources connected to the transistors 709, 710, 713, 714 controlled with the up signals UPD1, UPD2 and the down signals DND1, DND2 for the input data DI1, DI2 are current sources 711B, 712B, 715B, 716B configured to supply a current 2IADJ. The circuit illustrated in FIG. 8A is the same as the circuit illustrated in FIG. 7A in the other points.

Figure 8B:
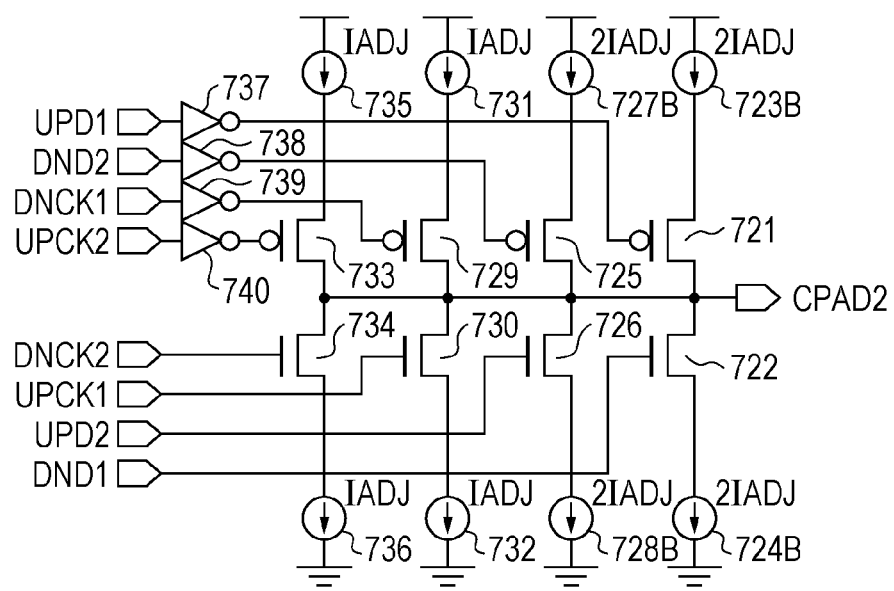

The circuit illustrated in FIG. 8B is different from the circuit illustrated in FIG. 7B in that the current sources connected to the transistors 721, 722, 725, 726 controlled with the up signals UPD1, UPD2 and the down signals DND1, DND2 for the input data DI1, DI2 are current sources 723B, 724B, 727B, 728B configured to supply the current 2IADJ. The circuit illustrated in FIG. 8B is the same as the circuit illustrated in FIG. 7B in the other points.

According to the first embodiment, it is possible to cancel the influence of interference between LC voltage controlled oscillators by adjusting the gains in the loops in CDR circuits in accordance with the phase differences between the input data and the phase differences between the output clocks of the CDR circuits, and to thus suppress deterioration in the characteristics of the CDR circuits due to the interference. In addition, the first embodiment makes it possible to arrange the LC voltage controlled oscillators (CDR circuits) adjacent to each other, thus reducing the area for implementation, so that the area efficiency can be improved.

Note that, in the first embodiment described above, the phase difference between the reference clock CKREF and each of the input data DI1, DI2 and the clocks CK1, CK2 is detected. However, since the clocks CK1, CK2 have a signal transition in every cycle, the clocks CK1, CK2 may be directly compared to detect the phase difference without using the reference clock CKREF.

Second Embodiment

Next, a second embodiment will be described.

Figure 9:
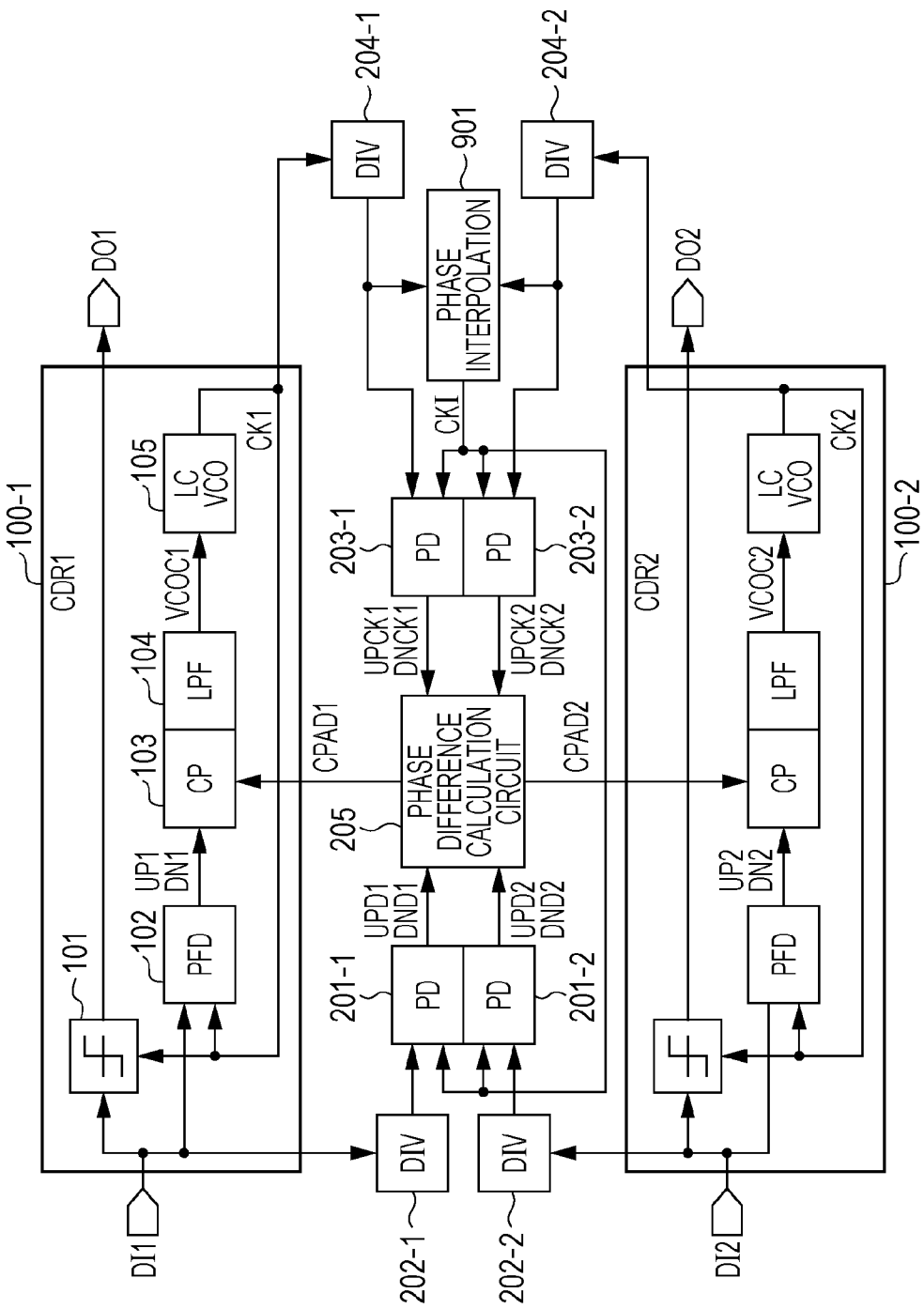
FIG. 9 is a diagram illustrating a configuration example of a receiving circuit in a second embodiment.

FIG. 9 is a diagram illustrating a configuration example of a receiving circuit in the second embodiment. FIG. 9 illustrates, as an example, a receiving circuit configured with two lanes through which two CDR circuits receive data and output data in parallel. In FIG. 9, constituent elements having the same functions as those of the constituent elements illustrated in FIG. 2 are denoted by the same signs, and redundant description is omitted.

In the receiving circuit in the first embodiment illustrated in FIG. 2, each of the phase detector circuits 201-1, 201-2 and the phase detector circuits 203-1, 203-2 detects the phase difference between its target signal and the reference clock CKREF. In contrast, in the second embodiment, a phase interpolation circuit 901 generates a clock with an intermediate phase from clocks CK1, CK2 through interpolation. In the example illustrated in FIG. 9, the phase interpolation circuit 901 interpolates the phase from the frequency-divided clocks CK1, CK2 frequency-divided by frequency divider circuits 204-1, 204-2 to generate a clock CKI. Then, each of phase detector circuits 201-1, 201-2 and phase detector circuits 203-1, 203-2 uses the output (clock) CKI of the phase interpolation circuit 901 as a reference clock, and detects a phase difference.

Figure 10:
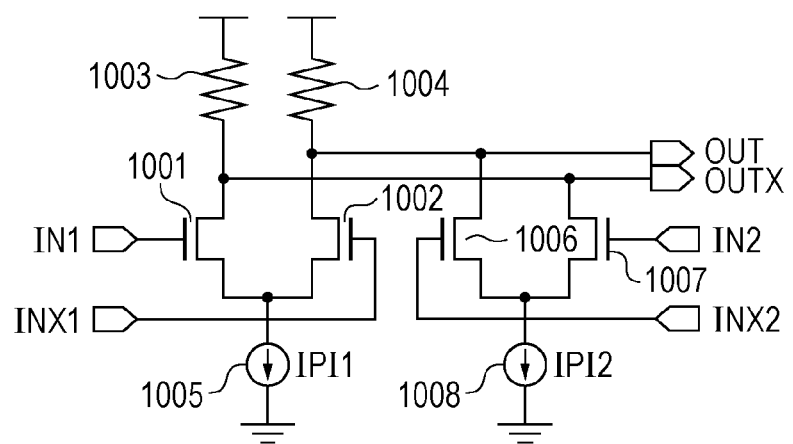
FIG. 10 is a diagram illustrating a configuration example of a phase interpolation circuit in the second embodiment.

FIG. 10 is a diagram illustrating a configuration example of the phase interpolation circuit 901 illustrated in FIG. 9. The phase interpolation circuit 901 includes: N-channel transistors 1001, 1002, 1006, 1007; resistors 1003, 1004; and current sources 1005, 1008. Each of the N-channel transistors 1001, 1002, 1006, 1007 is a MOS transistor, for example. The current source 1005 is a current source connected to the reference potential node and configured to supply a current IPI1. The current source 1006 is a current source connected to the reference potential node and configured to supply a current IPI2.

The N-channel transistor 1001 has a gate connected to a first positive-side input node IN1, a source connected to the current source 1005, and a drain connected to a negative-side output node OUTX. The N-channel transistor 1002 has a gate connected to a first negative-side input node INX1, a source connected to the current source 1005, and a drain connected to a positive-side output node OUT.

The N-channel transistor 1006 has a gate connected to a second negative-side input node INX2, a source connected to the current source 1008, and a drain connected to the positive-side output node OUT. The N-channel transistor 1007 has a gate connected to a second positive-side input node IN2, a source connected to the current source 1008, and a drain connected to the negative-side output node OUTX. The resistor 1003 has one end connected to the negative-side output node OUTX and the other end connected to the power supply potential node.

The resistor 1004 has one end connected to the positive-side output node OUT and the other end connected to the power supply potential node. For example, a signal on the positive side of a clock CK1 is inputted to the first positive-side input node IN1, a signal on the negative side of the clock CK1 (a inverted phase signal of the signal on the positive side) is inputted to the first negative-side input node INX1, a signal on the positive side of a clock CK2 is inputted to the second positive-side input node IN2, and a signal on the negative side of the clock CK2 (an inverted phase signal of the signal on the positive side) is inputted to the second negative-side input node INX2.

In the phase interpolation circuit 901 illustrated in FIG. 10, an output part of a differential pair in which one of the clocks CK1 and CK2 is inputted to the input nodes IN1, INX1 and an output part of a differential pair in which the other clock is inputted to the input nodes IN2, INX2 are connected, so that a ratio of interpolation can be changed by changing a ratio between the current values of the currents IPI1, IPI2 supplied to the respective differential pair. In the second embodiment, since it is suffices that clocks of specific phases are generated by interpolation, the ratio between the current values of the currents IPI1, IPI2 may be 1:1 (the ratio of interpolation is 1:1), for example.

According to the second embodiment, it is possible to cancel the influence of interference between LC voltage controlled oscillators included in CDR circuits, and to thus suppress deterioration in the characteristics of the CDR circuits due to the interference, and it is possible to arrange the LC voltage controlled oscillators (CDR circuits) adjacent to each other, thus reducing the area for implementation, so that the area efficiency can be improved, like the first embodiment. Moreover, the second embodiment makes it possible to generate the reference clock inside and to detect the phase difference between the input data and the phase difference between the output clocks without supplying the reference clock from outside.

Third Embodiment

Next, a third embodiment will be described.

Figure 11:
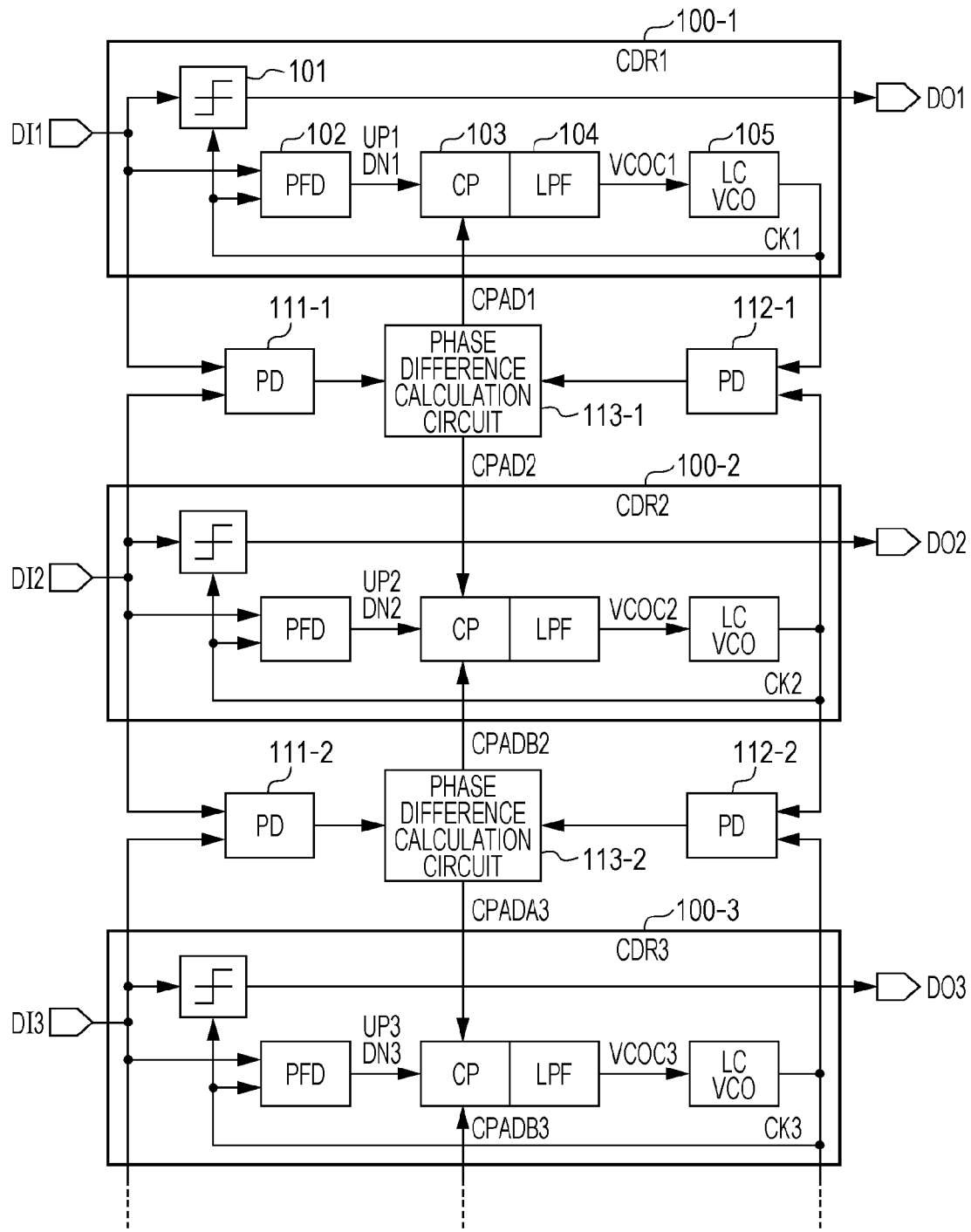
FIG. 11 is a diagram illustrating a configuration example of a receiving circuit in a third embodiment.

The above-described first and second embodiments have been described by giving the receiving circuits configured with two lanes through which two CDR circuits receive data and output data in parallel as examples. These receiving circuits, however, are not limiting, and a receiving circuit having three lanes or more may be used. FIG. 11 is a diagram illustrating a configuration example of a receiving circuit in the third embodiment. In FIG. 11, constituent elements having the same functions as those of the constituent elements illustrated in FIG. 1A are denoted by the same signs, and redundant description is omitted.

The interference between LC voltage controlled oscillators included in CDR circuits varies depending on their distance. For this reason, the larger their distance, the smaller the influence of the interference. Accordingly, when LC voltage controlled oscillators are distant from each other by two lanes or more, the influence of the interference therebetween may be ignored. In view of this, in the receiving circuit having three lanes or more, as illustrated in FIG. 11, each pair of adjacent two lanes are provided with: a phase detector circuit 111 configured to detect a phase difference between input data in the adjacent lanes; a phase detector circuit 112 configured to detect a phase difference between clocks in the adjacent lanes; and a phase difference calculation circuit 113 configured to generate an output for gain adjustment in accordance with the phase difference between the input data and the phase difference between the clocks, based on outputs of the phase detector circuits 111, 112.

For example, phase detector circuits 111-1, 112-1 and a phase difference calculation circuit 113-1 are provided for the lane of a CDR circuit 100-1 and the lane of a CDR circuit 100-2, which are adjacent to each other. The phase detector circuit 111-1 outputs an up signal and a down signal in accordance with the phase difference between input data DI1, DI2 in the adjacent lanes, and the phase detector circuit 112-1 outputs an up signal and a down signal in accordance with the phase difference between clocks CK1, CK2 in the adjacent lanes. The phase difference calculation circuit 113-1 generates outputs CPAD1, CPADA2 according to the difference between the phase difference between the input data DI1, DI2 and the phase difference between the clocks CK1, CK2, based on the up signals and the down signals outputted from the phase detector circuits 111-1, 112-1, and output the outputs CPAD1, CPADA2 to charge pump circuits 103 of the CDR circuits 100-1, 100-2.

In addition, for example, phase detector circuits 111-2, 112-2 and phase difference calculation circuit 113-2 are provided for the lane of the CDR circuit 100-2 and the lane of a CDR circuit 100-3, which are adjacent to each other. The phase detector circuit 111-2 outputs an up signal and a down signal in accordance with the phase difference between input data DI2, DI3 in the adjacent lanes, and the phase detector circuit 112-2 outputs an up signal and a down signal in accordance with the phase difference between clocks CK2, CK2 in the adjacent lanes. The phase difference calculation circuit 113-2 generates outputs CPADB2, CPADA3 according to the difference between the phase difference between the input data DI2, DI3 and the phase difference between the clocks CK2, CK3, based on the up signals and the down signals outputted from the phase detector circuits 111-2, 112-2, and output the outputs CPADB2, CPADA3 to the charge pump circuits 103 of the CDR circuits 100-2, 100-3.

Then, the charge pump circuit 103 and a loop filter 104 of the CDR circuit 100-1 generate a control voltage VCOC1 by performing addition or subtraction of a current (injection or extraction of electric charges) in accordance with the up signal UP1 and the down signal DN1, which are outputted from a phase-frequency detector circuit 102, and the output CPAD1 of the phase difference calculation circuit 113-1. The charge pump circuit 103 and a loop filter 104 of the CDR circuit 100-2 generate a control voltage VCOC2 by performing addition or subtraction of a current (injection or extraction of electric charges) in accordance with the up signal UP2 and the down signal DN2, which are outputted from the phase-frequency detector circuit 102, the output CPADA2 of the phase difference calculation circuit 113-1, and the output CPADB2 of the phase difference calculation circuit 113-2. In this way, in the lane sandwiched by two lanes (the lane on both sides of which other CDR circuits are arranged), the gains of up (UP) and down (DN) in the loop of the CDR circuit are adjusted in accordance with the phase difference between the input data and the phase difference between the clocks relative to each of the adjacent lanes.

According to the third embodiment, it is possible to cancel the influence of interference between LC voltage controlled oscillators included in CDR circuits, and to thus suppress deterioration in the characteristics of the CDR circuits due to the interference, even in the case of a receiving circuit having three lanes or more.

Fourth Embodiment

Next, a fourth embodiment will be described.

Figure 12:
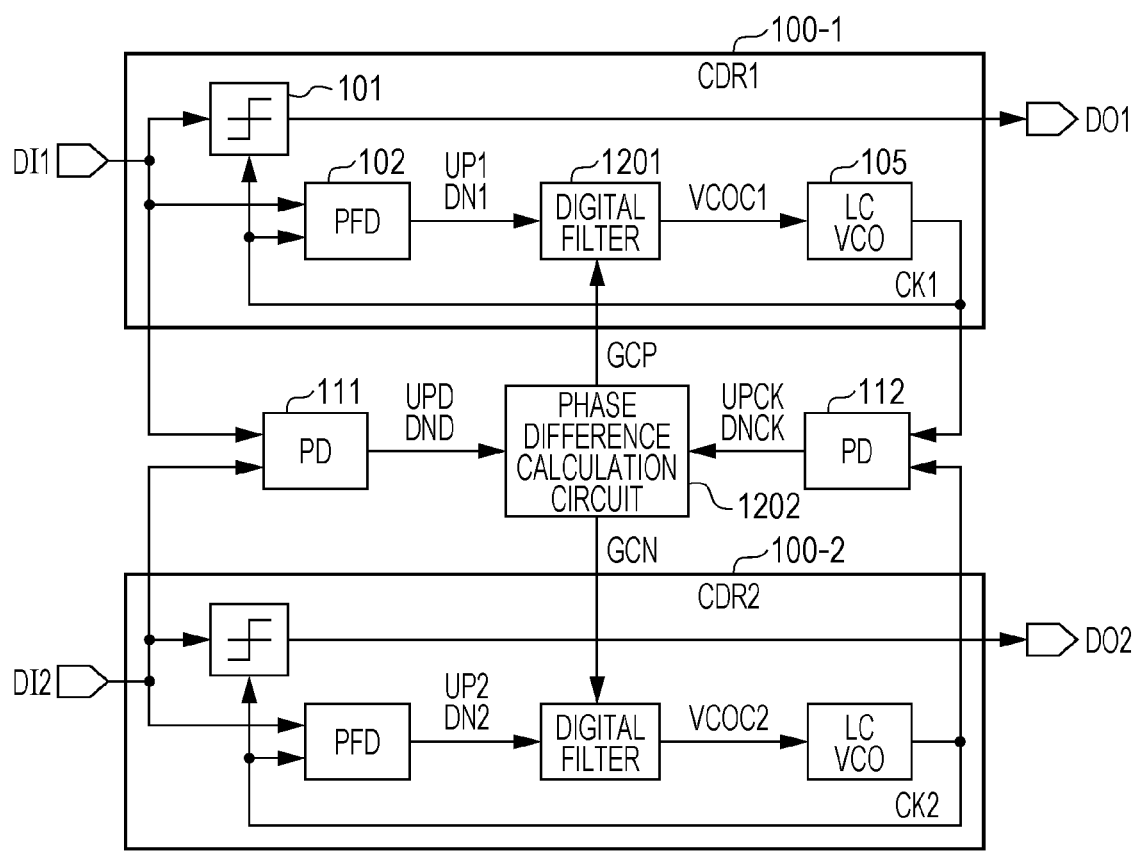
FIG. 12 is a diagram illustrating a configuration example of a receiving circuit in a fourth embodiment.

FIG. 12 is a diagram illustrating a configuration example of a receiving circuit in the fourth embodiment. In FIG. 12, constituent elements having the same functions as those of the constituent elements illustrated in FIG. 1A are denoted by the same signs, and redundant description is omitted. The receiving circuit in the fourth embodiment is what is obtained by digitizing the charge pump circuit and the loop filter in the CDR circuit 100, and a digital filter 1201 achieves functions corresponding to the above-described charge pump circuit and loop filter.

A phase difference calculation circuit 1202 generates gain adjustment codes GCP, GCN according to the difference between a phase difference between input data DI1, DI2 and a phase difference between clocks CK1, CK2, based on an up signal UPD and a down signal DND, which are outputted from a phase detector circuit 111, and an up signal UPCK and a down signal DNCK, which are outputted from a phase detector circuit 112. Note that the up signals UPD, UPCK and the down signals DND, DNCK, which are outputted from the phase detector circuits 111, 112 are not necessary to be digital signals, and it is suffices that at least the gain adjustment codes GCP, GCN, which are outputted from the phase difference calculation circuit 1202, are digital signals. The gain adjustment code GCP, which is outputted from the phase difference calculation circuit 1202, is supplied to the digital filter 1201 of the CDR circuit 100-1, and the gain adjustment code GCN, which is outputted from the phase difference calculation circuit 1202, is supplied to the digital filter 1201 of the CDR circuit 100-2.

The digital filter 1201 generates a control code VCOC for an LC voltage controlled oscillator 105 by performing digital signal processing based on the up signal UP and the down signal DN, which are digital signals, outputted from the phase-frequency detector circuit 102, and the gain adjustment code GC, which is outputted from the phase difference calculation circuit 1202. The oscillation frequency of the LC voltage controlled oscillator 105 is controlled by adjusting the capacitance value of a variable capacitor with the control code VCOC, so that the LC voltage controlled oscillator 105 outputs, as an output clock CK, a clock having a frequency according to the control code VCOC. Here, the variable capacitor included in the LC voltage controlled oscillator 105 suffices as long as its capacitance value is adjustable by digital control. For example, the LC voltage controlled oscillator 105 may be configured such that a plurality of capacitors are connected in parallel as the variable capacitor, and the capacitance value is adjusted by controlling electrical connection and disconnection of each capacitor with the control code VCOC.

Figure 13:
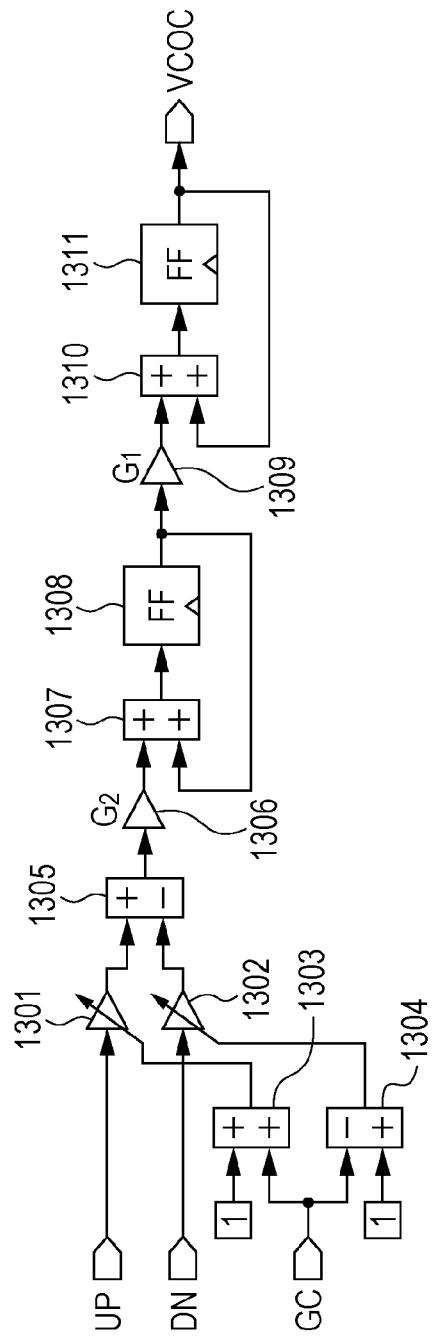
FIG. 13 is a diagram illustrating a configuration example of a digital filter in the fourth embodiment.
Figure 14:
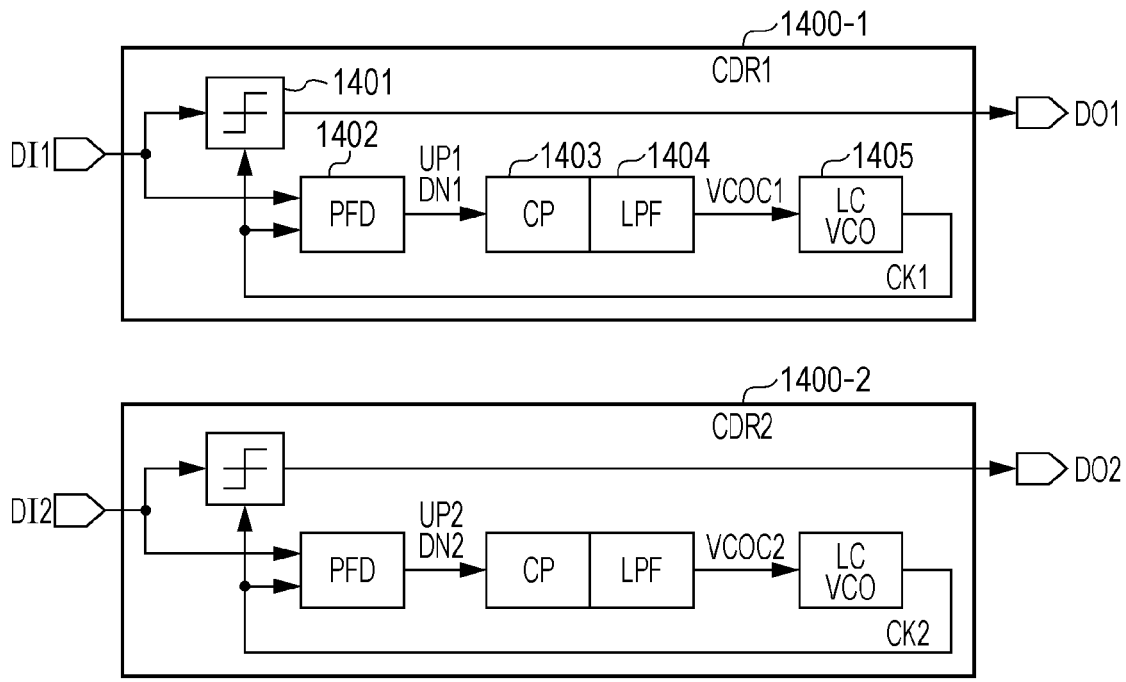
FIG. 14 is a diagram illustrating a receiving circuit having a plurality of CDR circuits arranged in parallel.
Figure 15:
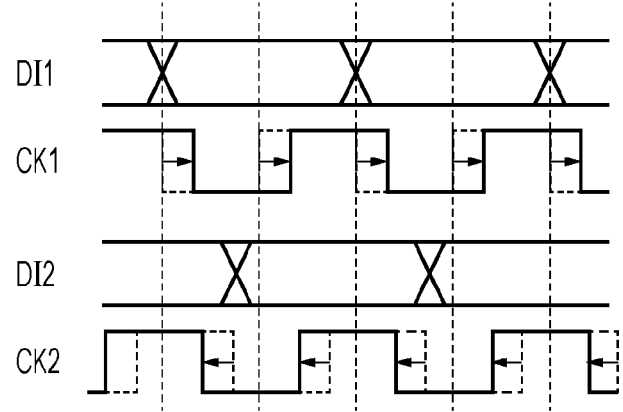
FIG. 15 is a diagram for explaining interference between LC voltage controlled oscillators.
Figure 16A:
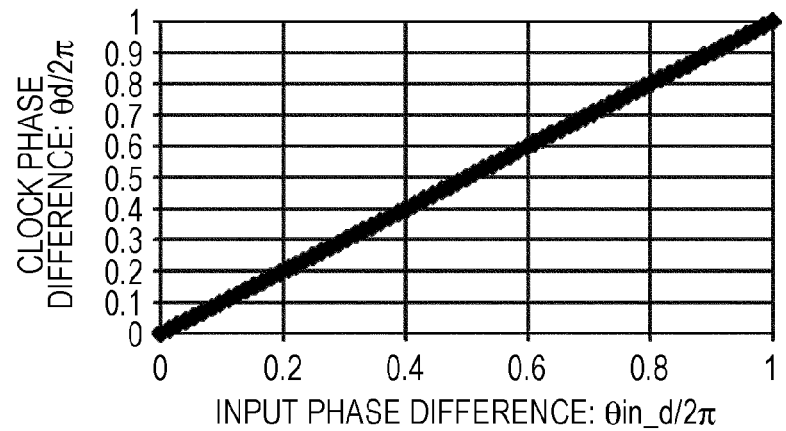
FIGS. 16A to 16C are diagrams indicating influences of interference between LC voltage controlled oscillators.
Figure 16B:
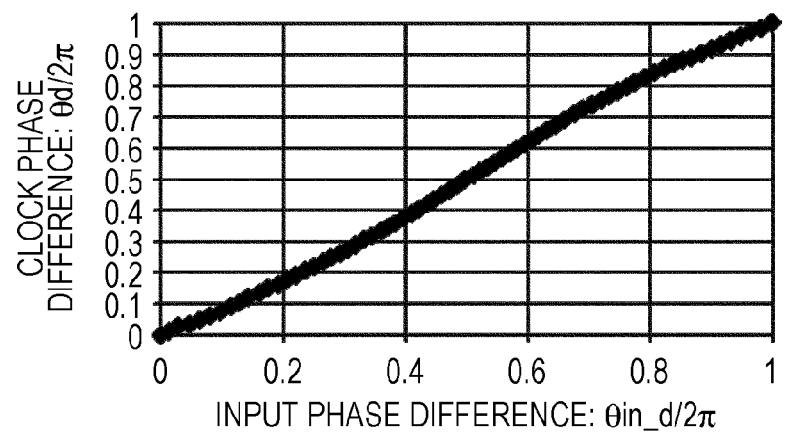
Figure 16C:
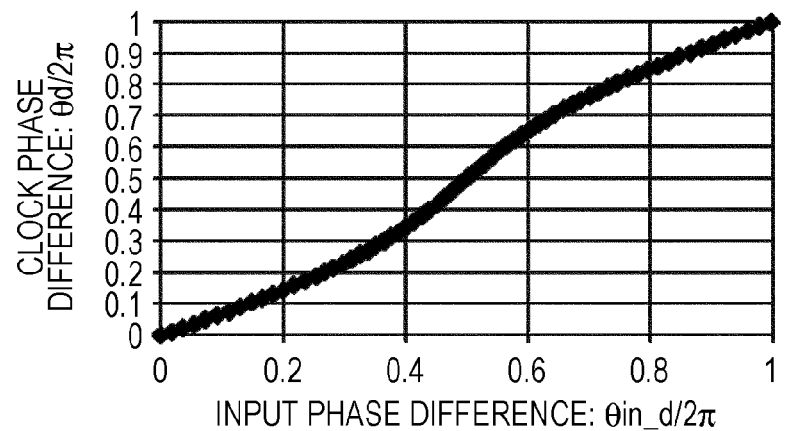

FIG. 13 is a diagram illustrating a configuration example of the digital filter 1201 in the fourth embodiment. The digital filter 1201 includes: multipliers 1301, 1302, 1306, 1309; adders 1303, 1304, 1307, 1310; and flip-flops 1308, 1311. Note that in FIG. 13, bit operation processing on digital signals and clocks for driving the flip-flops 1308, 1311 and the like are omitted.

The multiplier 1301 multiplies the inputted up signal UP by (1+GC) and outputs the result of the operation, where the value (1+GC) is obtained by the adder 1303 adding the inputted gain adjustment code GC to 1. The multiplier 1302 multiplies the inputted down signal DN by (1−GC) and outputs the result of the operation, where the value (1−GC) is obtained by the adder 1304 subtracting the inputted gain adjustment code GC from 1. The adder 1305 subtracts the output value of the multiplier 1302 from the output value of the multiplier 1301 and outputs the result of the operation. In this way, the inputted up signal UP and down signal DN are multiplied by (1+GC) and (1−GC), respectively, in accordance with the gain adjustment code GC, so that the ratios of the gains of up (UP) and down (DN) in the loop of the CDR circuit 100 are adjusted.

The multiplier 1306 multiplies the output value of the adder 1305 and a filter coefficient G2. The adder 1307 adds an output value of the multiplier 1306 and an output value of the flip-flop 1308. The flip-flop 1308 holds and outputs an output value of the adder 1307. In other words, the multiplier 1306, the adder 1307, and the flip-flop 1308 achieves an integrating circuit configured to feed back and add the output of the flip-flop 1308.

In addition, the multiplier 1309 multiplies the output value of the flip-flop 1308 and a filter coefficient G1. The adder 1310 adds an output value of the multiplier 1309 and an output value of the flip-flop 1311. The flip-flop 1311 holds and outputs an output value of the adder 1310. In other words, the multiplier 1309, the adder 1310, and the flip-flop 1311 achieves an integrating circuit configured to feedback and add the output of the flip-flop 1311. An output of the flip-flop 1311 is outputted as the control code VCOC.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A receiving circuit comprising:
a plurality of clock-and-data recovery circuits arranged in parallel, each clock-and-data recovery circuit including an LC voltage controlled oscillator configured to generate a clock having an oscillation frequency according to an inductor and a capacitor, and each clock-and-data recovery circuit being configured to sample a piece of input data with an output clock of the LC voltage controlled oscillator and adjust the oscillation frequency of the LC voltage controlled oscillator in accordance with a phase difference and a frequency difference between the piece of input data and the output clock of the LC voltage controlled oscillator, thereby recovering data and a clock based on the piece of input data; and
a gain adjustment circuit configured to adjust ratios of gains of up and down of the oscillation frequency of the LC voltage controlled oscillator in a loop in each of the clock-and-data recovery circuits arranged adjacent to each other, in accordance with a phase difference between the pieces of input data and a phase difference between the output clocks of the respective clock-and-data recovery circuits.

2. The receiving circuit according to claim 1, wherein the gain adjustment circuit is further configured to include:
a first phase detector circuit configured to detect the phase difference between the pieces of input data;
a second phase detector circuit configured to detect the phase difference between the output clocks; and
a phase difference calculation circuit configured to adjust the gains in the loop in each of the clock-and-data recovery circuit, in accordance with a difference between the phase difference between the pieces of input data and the phase difference between the output clocks, based on results of the detection of the first phase detector circuit and the second phase detector circuit.

3. The receiving circuit according to claim 2,
wherein the first phase detector circuit is further configured to include a third phase detector circuit configured to detect a phase difference between a reference clock and a corresponding piece of input data in each of the clock-and-data recovery circuits arranged adjacent to each other and a fourth phase detector circuit configured to detect a phase difference between the reference clock and a corresponding piece of input data in each of the clock-and-data recovery circuits arranged adjacent to each other,
wherein the second phase detector circuit is further configured to include a fifth phase detector circuit configured to detect a phase difference between the reference clock and a corresponding output clock in each of the clock-and-data recovery circuits arranged adjacent to each other and a sixth phase detector circuit configured to detect a phase difference between the reference clock and a corresponding output clock in each of the clock-and-data recovery circuits arranged adjacent to each other.

4. The receiving circuit according to claim 3, further comprising:
a phase interpolation circuit configured to generate a clock based on the output clock of each of the clock-and-data recovery circuits arranged adjacent to each other, and output the generated clock as the reference clock.

5. The receiving circuit according to claim 2, wherein
the piece of input data and the output clock of each of the clock-and-data recovery circuits are frequency-divided, and
the first phase detector circuit and the second phase detector circuit detect the phase difference between the pieces of input data and the phase difference between the output clocks by use of the frequency-divided pieces of input data and output clocks.

6. The receiving circuit according to claim 5, wherein frequency division ratios for the pieces of input data and the output clocks are set such that the gains of the first phase detector circuit and the second phase detector circuit are equalized.

7. The receiving circuit according to claim 2, wherein a weight on the phase difference between the pieces of input data and a weight on the phase difference between the output clocks are set such that the gains of the first phase detector circuit and the second phase detector circuit are equalized.

8. The receiving circuit according to claim 1,
wherein each of the clock-and-data recovery circuits is further configured to include:
a phase-frequency detector circuit configured to detect a phase difference and a frequency difference between the piece of input data and the output clock of the LC voltage controlled oscillator; and
a control circuit configured to supply the LC voltage controlled oscillator with a control signal used to control the oscillation frequency of the LC voltage controlled oscillator, and
wherein the control circuit outputs the control signal according to a result of the detection of the phase-frequency detector circuit and an output of the gain adjustment circuit.

9. The receiving circuit according to claim 8, wherein the control circuit is further configured to include:
a charge pump circuit configured to perform an addition or subtraction of a current on the control signal in accordance with the result of the detection of the phase-frequency detector circuit and the output of the gain adjustment circuit; and
a filter configured to filter a high-frequency component of an output of the charge pump circuit.

10. The receiving circuit according to claim 8, wherein the control circuit is further configured to include:
a digital filter configured to generate the control signal by performing digital signal processing on the result of the detection of the phase-frequency detector circuit and the output of the gain adjustment circuit.

\* \* \* \* \*